(12) United States Patent
Ueyama et al.

(10) Patent No.: US 7,017,637 B2
(45) Date of Patent: Mar. 28, 2006

(54) THIN FILM FORMING APPARATUS AND THIN FILM FORMING METHOD

(75) Inventors: Tsutomu Ueyama, Kyoto (JP); Izuru Iseki, Kyoto (JP); Norio Sato, Kanagawa (JP); Katsuyuki Machida, Kanagawa (JP); Hakaru Kyuragi, Tokyo (JP)

(73) Assignees: Dainippon Screen Mfg. Co. Ltd., (JP); Nippon Telegraph and Telephone Corporation, (JP)

( * ) Notice: Subject to any disclaimer, the term of this patent is extended or adjusted under 35 U.S.C. 154(b) by 274 days.

(21) Appl. No.: 10/251,475

(22) Filed: Sep. 18, 2002

(65) Prior Publication Data

US 2003/0056725 A1    Mar. 27, 2003

(30) Foreign Application Priority Data

Sep. 25, 2001 (JP) ............................. 2001-290772
Aug. 6, 2002 (JP) ............................. 2002-228343

(51) Int. Cl.
*B32B 31/20* (2006.01)
*C23C 14/54* (2006.01)

(52) U.S. Cl. ................. 156/382; 156/580; 118/50

(58) Field of Classification Search .......... 118/50, 118/712; 438/455; 156/230, 286, 282, 540
See application file for complete search history.

(56) References Cited

U.S. PATENT DOCUMENTS

| | | | | |
|---|---|---|---|---|
| 4,316,757 A | * | 2/1982 | Walsh ........................... | 156/286 |
| 4,933,042 A | * | 6/1990 | Eichelberger et al. ....... | 156/239 |
| 5,078,820 A | * | 1/1992 | Hamamura et al. .......... | 156/267 |
| 5,641,372 A | * | 6/1997 | Okuno ......................... | 156/230 |
| 5,972,780 A | * | 10/1999 | Machida et al. ............. | 438/455 |

FOREIGN PATENT DOCUMENTS

| | | |
|---|---|---|
| EP | 0244951 A2 | 11/1987 |
| EP | 0272141 A2 | 6/1988 |
| EP | 0283740 A2 | 9/1988 |
| EP | 0302345 A2 | 2/1989 |
| EP | 0370233 A1 | 5/1990 |
| EP | 0391035 A2 | 10/1990 |
| EP | 0536752 A2 | 4/1993 |
| EP | 0572913 A1 | 12/1993 |
| EP | 0587168 A1 | 3/1994 |
| EP | 0726099 A2 | 8/1996 |
| EP | 0836895 A2 | 4/1998 |
| GB | 2193482 A | 10/1988 |
| JP | 56-142629 | 11/1981 |

(Continued)

OTHER PUBLICATIONS

Wai et al. "Supercritical fluid extraction: metals as complexes", *Journal of Chromatography*, 785 (1997) 369-383.

(Continued)

*Primary Examiner*—Laura Edwards
(74) *Attorney, Agent, or Firm*—Ostrolenk, Faber, Gerb & Soffen, LLP

(57) ABSTRACT

Prior to the start of transfer of an insulation film to a substrate, the degree of opening of a butterfly valve is set small so that evaporation of a solvent component contained in the insulation film is suppressed and the fluidity of the insulation film is ensured at the start of the transfer. On the other hand, the butterfly valve is totally opened at the start of the transfer, so that the pressure inside a thin film forming chamber rapidly decreases and transfer of the insulation film to the substrate is performed always in a low-pressure state (high-degree of vacuum).

14 Claims, 5 Drawing Sheets

FOREIGN PATENT DOCUMENTS

| JP | 60-238479 | | 11/1985 |
| --- | --- | --- | --- |
| JP | 60-246635 | A | 12/1985 |
| JP | 61-231166 | | 10/1986 |
| JP | 2-125619 | | 6/1987 |
| JP | 10-144757 | | 5/1988 |
| JP | 1045131 | | 2/1989 |
| JP | 2-148841 | | 6/1990 |
| JP | 2-151027 | * | 6/1990 |
| JP | 2-30491 | | 12/1990 |
| JP | 7142333 | A | 6/1993 |
| JP | 06-333808 | | 12/1994 |
| JP | 7-27711 | | 1/1995 |
| JP | 8222508 | A | 8/1996 |
| JP | 10-189566 | | 7/1998 |
| JP | 63-303059 | | 12/1998 |
| JP | 2001-135623 | | 5/2001 |
| JP | 2001-135629 | | 5/2001 |
| WO | 87/07309 | | 12/1987 |
| WO | 90/06189 | | 6/1990 |
| WO | 90/13675 | | 11/1990 |
| WO | 99/49998 | | 10/1999 |
| WO | 01/78911 | | 10/2001 |

OTHER PUBLICATIONS

"Los Alamos National Laboratory", *Solid State Technology* (1998) 810.

Guan et al. "Fluorocarbon-Based Heterophase Polymeric Materials. Block Copolymer Surfactants for Carbon Dioxide Applications", *Macromolecules* (1994) 27.

"Phase Diagram of $CO_2$", *International Journal of Environmental*, Design & Manufacturing, vol. 2, No. 1, (1993) 81-86.

Journal of the American Ceramic Society, vol. 72, No. 6, 872.

Ziger et al. "Compressed Fluid Technology: Application to RIE-Developed Resists", *AIChE Journal*, vol. 33, No. 10 (1987) 1585.

*Encyclopedia of Chemical Technology*, Third Edition, Supplement Volume (1984).

"Cleaning With Supercritical $CO_2$", *Technical Support Package*, Marshall Space Flight Center (1979).

"Supercritical fluids: still seeking acceptance", *Chemical Engineering*, vol. 92, Issue 3 (Feb. 1985) 14.

Takahashi, Dean "Los Alamos Lab Finds Way to Cut Chip Toxic Waste", (Jun. 1998).

"Supercritical $CO_2$ process offers less mess from semiconductor plants", *Chimentator* (1998).

Sun, et al., "Preparation of polymer-protected semiconductor nanoparticles through the rapid expansion of supercritical fluid solution", *Chemical Physics Letters*, 288 (1998) 585-588.

Jackson et al., "Surfactants and Microemulsions in Supercritical Fluids", *Supercritical Fluid Cleaning*, (1998) 87.

Kryszewski, Marian, "Wytwarzanie malych czastek metali i polprzewodnikow w ukladach polimerowych*", *Polimery*, (Feb. 1998) 65-134.

Baker et al., "Surface Cleaning and Carbonaceous Film Removal Using High Pressure, High Temperature Water, and Water/$CO_2$ Mixtures", *J Electrochem. Soc.*, vol. 145, No. 1 (Jan. 1998).

Ober et al., "Imaging Polymers with Supercritical Carbon Dioxide", *Advanced Materials*, vol. 9, No. 13 (Nov. 1997).

Russick et al., "Supercritical Carbon Dioxide Extraction of Solvent from Micromachined Structures", *Supercritical Fluids*, Chapter 18, (Oct. 1997).

Dahmen, et al., "Supercritical Fluid Extraction of Grinding and Metal Cutting Waste Contaminated with Oils", *SFE of Waste Contaminated with Oils*, Chapter 19, (Oct. 1997).

Xu et al., "Submicron-sized spherical yttrium oxide based phosphors prepared by supercritical $CO_2$-assisted aerosolization and pyrolysis", *Appl. Phys. Lett.*, vol. 71, No. 12, (Sep. 1997).

"Abstracts of Papers: Part 1", $214^{th}$ *ACS National Meeting 8412-3530-9*, American Chemical Society (Sep. 1997).

Buhler et al., "Linear array of complementary metal oxide semiconductor double-pass metal micromirrors", *Opt. Eng.*, 36(5), 1391-1398 (May 1997).

Jo et al., "Evaluation of $SiO_2$ aerogel thin film with ultra low dielectric constant as an intermetal dielectric", *Microelectronic Engineering*, 33, 343-348 (Jan. 1997).

McClain et al., "Design of Nonionic Surfactants for Supercritical Carbon Dioxide", *Science*, vol. 274 (Dec. 1996).

Znaidi et al., "Batch and Semi-continuous Synthesis of Magnesium Oxide Powders from Hydrolysis and Supercritical Treatment of $Mg(OCH_3)_2$", *Materials Research Bulletin*, vol. 31, No. 12, (1996) 1527-1535.

Tadros et al., "Synthesis of Titanium Dioxide Particles in Supercritical $CO_2$", *The Journal of Supercritical Fluids*, vol. 9, (Sep. 1996) 172-176

Courtecuisse et al., "Kinetics of the Titanium Isopropoxide Decomposition in Supercritical Isopropyl Alcohol", *Ind. Eng. Chem. Res.*, vol. 35, (Aug. 1996) 2539-2545.

Gabor et al., "Block and Random Copolymer Resists Designed for 193 nm Lithography and Environmentally Friendly Supercritical $CO_2$ Development", *SPIE*, vol. 2724 (Jun. 1996).

Schimek et al., "Supercritical Ammonia Synthesis and Characterization of Four New Alkali Metal Silver Antimony Sulfides: $MAg_2SbS_4$ and $M_2AgSbS_4$ (M=K, Rb)", *Journal of Solid State Chemistry*, vol. 123 (May 1996) 277-284.

Gallagher-Wetmore, Paula, "Supercritical Fluid Processing: Opportunities for New Resist Materials and Processes", *SPIE*, vol. 2725 (Apr. 1996).

Papathomas et al., "Debonding of Photoresists by Organic Solvents", *Journal of Applied Polymer Science*, vol. 55, (Mar. 1996).

Watkins et al., "Polymer/metal Nanocomposite Synthesis in Supercritical $CO_2$", *Chemistry of Materials*, vol. 7, No. 11 (Nov. 1995).

Gloyna et al., "Supercritical Water Oxidation Research and Development Update", *Environmental Progress*, vol. 14, No. 3, (Aug. 1995).

Gallagher-Wetmore, Paula, "Supercritical Fluid Processing: A New Dry Technique for Photoresist Developing", *SPIE*, vol. 2438 (Jun. 1995).

Gabor et al., "Silicon-Containing Block Copolymer Resist Materials", *Microelectronics Technology*, Chapter 19 (1995).

Tsiartas et al., "Advances in Resist Technology and Processing XII", *SPIE*, vol. 2438 (1995).

Wood et al., "Synthesis of New Channeled Structures in Supercritical Amines: Preparation and Structure of $RbAg_5S_3$ and $CsAg_7S_4$", *Inorg. Chem.*, vol. 33 (1994).

Jerome et al., "Synthesis of New Low-Dimensional Quaternary Compounds, $KCu_2AsS_3$ and $KCu_4AsS_4$, in Supercritical Amine Solvent. Alkali Metal Derivatives of Sulfosalts", *Inorg. Chem.*, vol. 33, 1733-1734 (1994).

McHardy et al., "Progress in Supercritical $CO_2$ Cleaning", *SAMPE Journal*, vol. 29, No. 5, (Sep./Oct. 1993).

"The First RTM Resin That's Tough Enough to Stand up Under Pressure", *SAMPE Booth No. 429*, 3M (1993).

Purtell et al., "Precision parts cleaning using supercritical fluids", *J. Vac. Sci. Technol. A*, vol. 11, No. 4, (Jul./ Aug. 1993).

Bok et al., "Supercritical Fluids for Single Wafer Cleaning", *Solid State Technology*, ( Jun. 1992).

Adschiri et al., "Rapid and Continuous Hypothermal Crystallization of Metal Oxide Particles in Supercritical Wafer", *J. Am. Ceram. Soc.*, vol. 75, No. 4, 1019-1022 (1992).

Hansen et al., "Supercritical Fluid Transport-Chemical Deposition of Films", *Chem. Mater*, vol. 4, 749-752 (1992).

Page et al., "Predictability and Effect of Phase Behavior of $CO_2$/Propylene Carbonate in Supercritical Fluid Chromatography", *J. Microcol.*, Sep. 3, 355-369 (1991).

Brokamp et al., "Synthese und Kristallstruktur eines gemischtvalenten Lithium-Tantalnitrids $Li_2Ta_3N_5$", *Journal of Alloys and Compounds*, vol. 176, 47-60 (1991).

Hybertson et al., "Deposition of Palladium Films by a Novel Supercritical Fluid Transport-Chemical Deposition Process", *Mat. Res. Bull.*vol. 26, 1127-1133 (1991).

Ziger et al., "Compressed Fluid Technology: Application to RIE-Developed Resists", *IChE Journal*, vol. 33, No. 10, (Oct. 1987).

Matson et al., "Rapid Expansion of Supercritical Fluid Solutions: Solute Formation of Powders, Thin Films, and Fibers", *Ind. Eng. Chem. Res.*, vol. 26, 2298-2306 (1987).

Tolley et al., "Stripping Organics from Metal and Mineral Surfaces Using Supercritical Fluids", *Separation Science and Technology*, vol. 22, Nos. 2-3, 1087-1101 (1987).

"Final Report on the Safety Assessment of Propylene Carbonate", *Journal of the American College of Toxicology*, vol. 6, No. 1, (1987).

Itakura et al., "Multi-Chamber Dry Etching System", *Solid State Technology*, (Apr. 1982).

Rubin et al., "A Comparison of Chilled DI Water/Ozone and CO2-Based Supercritical Fluids as Replacements for Photoresist-Stripping Solvents", *IEEE/CPMT Int's Elect. Mfg. Tech. Symposium*, (1998).

\* cited by examiner

THIN FILM FORMING APPARATUS AND THIN FILM FORMING METHOD

BACKGROUND OF THE INVENTION

1. Field of the Invention

The present invention relates to a thin film forming apparatus and a thin film forming method, which require to press a substrate and a sheet film against each other within a thin film forming chamber so that a thin film, such as an insulation film, disposed on the sheet film in advance is transferred onto the substrate and a thin film is accordingly disposed on the substrate.

2. Description of the Related Art

Over the recent years, it has became necessary to use a thin film forming method suitably applicable to a large area size as wafers for the manufacture of LSIs have became larger in diameter, liquid crystal panels have became larger in area size, etc. In addition, in the field of multilevel interconnections techniques for manufacturing LSIs, as the surface of an insulation film needs be planarized accurately to realize multilevel interconnections. It is not only necessary to handle an increase in surface area but surface planarization techniques to form thin films as well are in an increasing demand. In an effort to satisfy these requirements, thin film forming techniques for forming a thin film on a substrate by a pressure transfer method have been proposed.

This type of thin film forming apparatus may be an apparatus which is described in Japanese Patent Application Laid-Open Gazette No. H10-189566 for instance. In this apparatus, a specimen holder comprising a built-in heater is disposed within a thin film forming chamber which is located inside a processing container. A semiconductor wafer, a glass substrate for liquid crystal panel or the like (hereinafter referred as "substrate") on which a thin film is to be formed can be held on the specimen holder. Further, a transfer plate is disposed below the specimen holder so as to face the specimen holder within the thin film forming chamber, and holds the sheet film with the thin film, which is disposed on the sheet film so that the thin film faces to the substrate. Like the specimen holder, the transfer plate as well comprises a heater, so that it is possible to heat up the sheet film which is held on the transfer plate.

A vacuum pump is linked to the thin film forming chamber. The substrate is held on the specimen holder and the sheet film is held on the transfer plate, and after the thin film forming chamber is closed air-tight, the thin film forming chamber is evacuated by the vacuum pump. Following this, while evacuating and depressurizing the thin film forming chamber by the vacuum pump, the specimen holder holding the substrate and the transfer plate holding the sheet film are moved closer to each other. Thus, the substrate and the sheet film are pressed against each other, and the thin film on the sheet film is transferred onto the substrate. As the thin film is disposed on the substrate in this manner, after moving the substrate and the sheet film back to their original positions, the thin film forming chamber is returned back to the atmospheric pressure. Finally, the substrate with the thin film and the sheet film without the thin film are unloaded out from the processing container.

By the way, in a conventional thin film forming apparatus of the pressure transfer method, after setting the substrate and the sheet film respectively to the specimen holder and the transfer plate, the vacuum pump starts to evacuate and depressurize the thin film forming chamber. Simultaneously with evacuating and depressurizing, transfer of the thin film to the substrate is executed. However, in the conventional apparatus, while the thin film forming chamber is simply evacuated and depressurized by the vacuum pump, there is no special consideration given on the pressure inside the thin film forming chamber (degree of vacuum) as it is before and during the transfer, thus leaving a room for improvement for excellent creation of a thin film. For instance, although the thin film needs to have a certain level of fluidity so as to be transferred favorably to the substrate, as the pressure inside the thin film forming chamber is largely reduced prior to the start of the transfer, a solvent component contained in the material of the thin film evaporates in a great quantity owing to the lowered pressure inside the thin film forming chamber. The fluidity of the thin film therefore would have deteriorated by the time the transfer starts, thereby making it impossible to favorably transfer the thin film to the substrate in some cases. Conversely, but for sufficient depressurization of the thin film forming chamber during transfer, the transfer of the thin film to the substrate could leave a void between a pattern formed in the substrate, such as a contact hole, and the thin film, in which case excellent transfer becomes impossible. Thus, an optimal value of the pressure inside the thin film forming chamber is different between before and during the transfer, and hence, in order to execute excellent transfer, it is important to flexibly and precisely control the pressure inside the thin film forming chamber. Despite this, such pressure control is difficult in the conventional apparatus.

SUMMARY OF THE INVENTION

A major object of the present invention is to provide a thin film forming apparatus and a thin film forming method, with which it is possible to favorably transfer a thin film to a substrate.

In fulfillment of the foregoing object, a thin film forming apparatus and a thin film forming method are provided and are particularly well suited to excellent transfer of a thin film, which is formed on a sheet film, to a substrate. A pressure value (degree of vacuum) desired for execution of excellent transfer is different between before and during transfer of a thin film to a substrate. Hence, the pressure inside a thin film forming chamber is controlled to proper values before and during transfer according to the present invention.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

Figure 1:
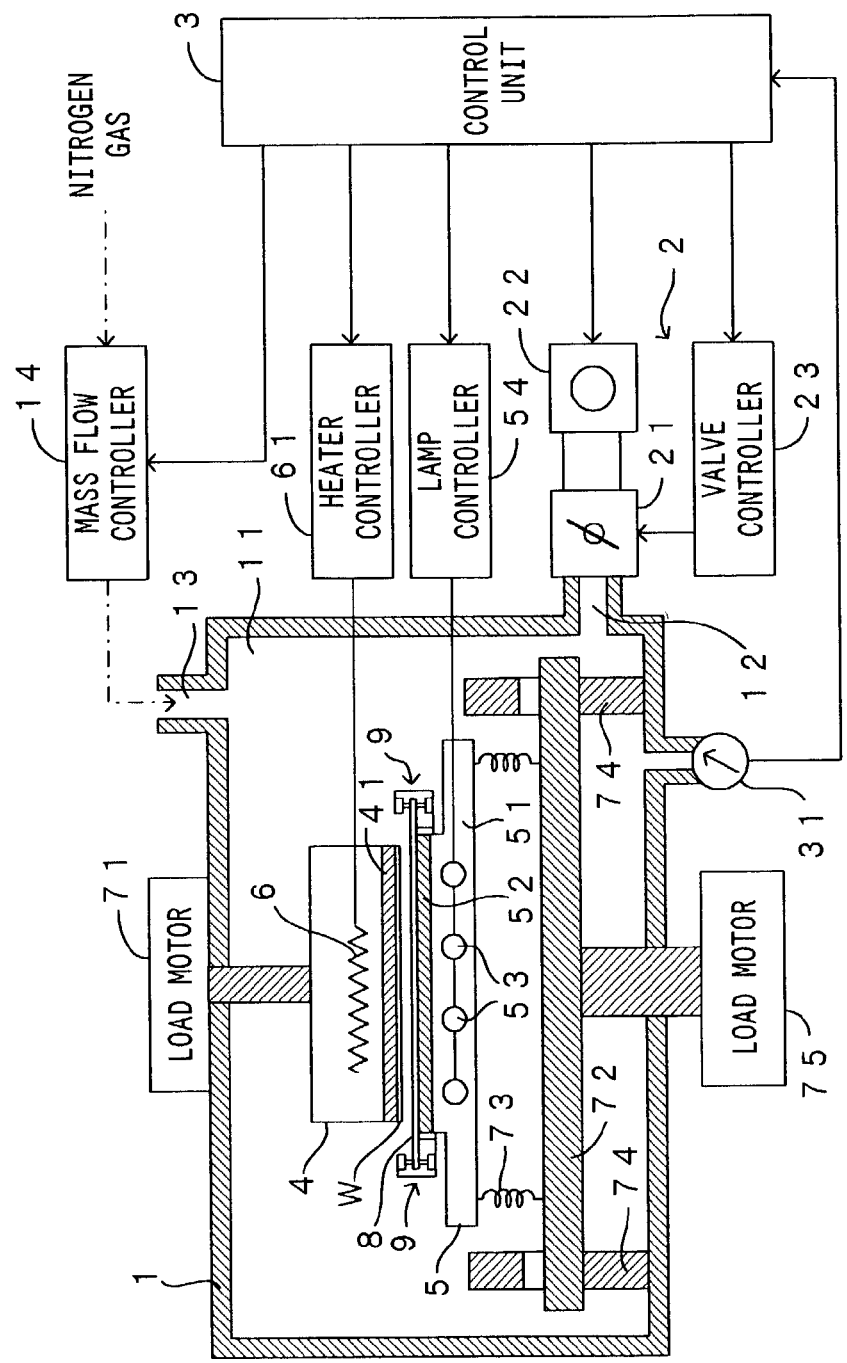
FIG. 1 is a drawing of a first preferred embodiment of a thin film forming apparatus according to the present invention.
Figure 2:
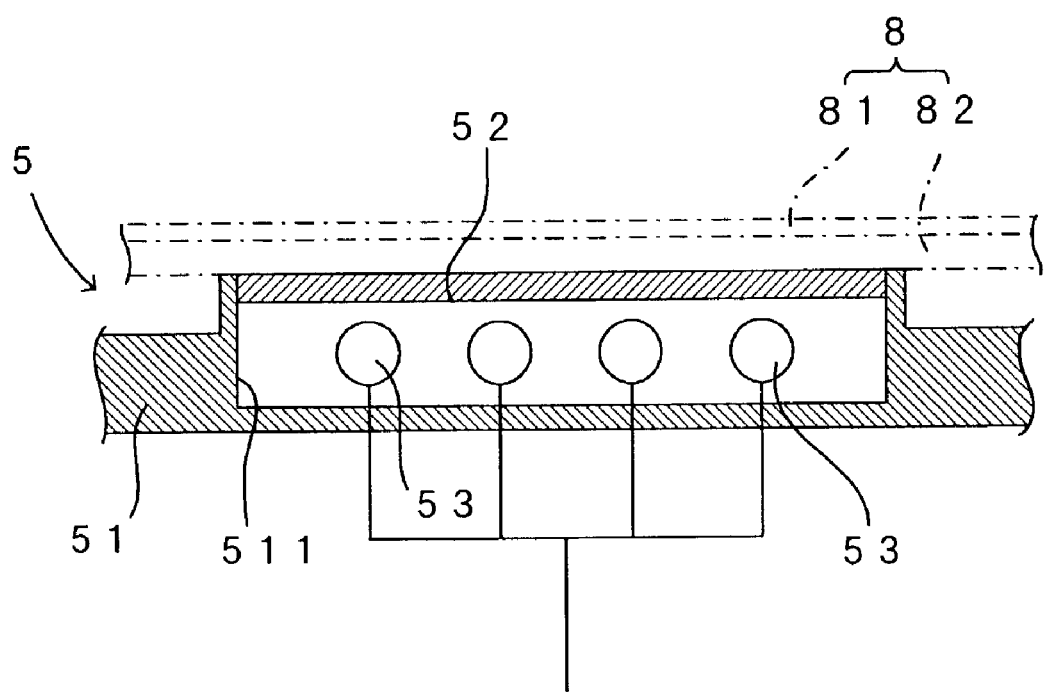
FIG. 2 is a partially expanded cross sectional view of the thin film forming apparatus shown in FIG. 1.

FIG. 1 is a drawing of a first preferred embodiment of a thin film forming apparatus according to the present invention. FIG. 2 is a partially expanded cross sectional view of the thin film forming apparatus shown in FIG. 1. This thin film forming apparatus comprises a processing container 1 whose inside is a thin film forming chamber 11 as described later which is for performing transfer. Further, an exhaust vent 12 is formed in a side bottom surface of the processing container 1, and a pressure control unit 2 which adjusts the pressure inside the thin film forming chamber 11 is connected to the exhaust vent 12.

In the pressure control unit 2, a vacuum pump 22 is linked to the thin film forming chamber 11 via a butterfly valve 21. When the butterfly valve 21 is open and the vacuum pump 22 works in accordance with an operation signal received from a control unit 3 which controls the entire apparatus, the thin film forming chamber 11 is evacuated and depressurized. In addition, the pressure control unit 2 comprises a valve controller 23 which controls the degree of opening of the butterfly valve 21. The valve controller 23 controls opening and closing of the butterfly valve 21 to adjust the amount of valve opening in accordance with a valve opening signal received from the control unit 3. Thus, the volume of exhaust air from the thin film forming chamber 11 per unit time is adjusted and the pressure inside the thin film forming chamber 11 (degree of vacuum) is controlled. As described above, according to this embodiment, the butterfly valve 21, the vacuum pump 22 and the valve controller 23 respectively function as "exhaust adjusting unit," "exhausting unit" and "pressure adjusting unit" and the pressure inside the thin film forming chamber 11 is therefore adjustable. According to this embodiment, for the purpose of accurately controlling the pressure inside the thin film forming chamber 11, a pressure gauge 31 is disposed to measure the pressure inside the thin film forming chamber 11. A result of the measurement obtained by the pressure gauge 31 is outputted to the control unit 3, and feedback control based on the measurement result is executed.

Further, an inlet 13 is formed in a top peripheral portion of the processing container 1, which allows to supply nitrogen gas flowing at a constant rate into the thin film forming chamber 11 through the inlet 13. In short, the inlet 13 is connected with a nitrogen gas supplying source (not shown) via a mass flow controller 14, and the mass flow controller 14 controls the inflow of nitrogen gas which is supplied to the thin film forming chamber 11 through the inlet 13. Although this embodiment requires to supply nitrogen gas for the purpose of realizing excellent transfer as described later, the type of gas to be supplied to the thin film forming chamber 11 is not limited to this but may be any gas which is appropriate for the process of transfer.

In the thin film forming chamber 11 whose pressure is adjusted, a first and a second plates 4 and 5 are housed one above and the other below so as to face with each other. Of these plates, the first plate 4 is capable of holding a substrate W, on which a thin film is to be disposed, on a lower surface of the first plate 4 faced with the second plate 5, and thus serves as "substrate holding means" of the present invention. The substrate W may comprise a semiconductor wafer formed in the shape of a disk and aluminum interconnection which is patterned as an electrode interconnection on the semiconductor wafer, for instance. An example that an insulation film (thin film) described later is transferred onto the pattern-bearing surface of the substrate W will now be described.

A quartz plate 41 polished to achieve a planar surface is disposed to the lower surface of the first plate 4, and the substrate W is disposed on the quartz plate 41. The reason of using quartz as the material of the plate 41 which directly contacts the substrate W is because quartz does not contain a substance which contaminates the substrate W and because quartz can be easily worked on and planarized easily to a necessary degree.

Further, a heater 6 is disposed as heating means inside the first plate 4. The heater 6 is controlled to a temperature between 25° C. and 300° C. by a heater controller 61 based on a substrate temperature signal received from the control unit 3. The first plate 4 is hung inside the processing container 1 in such a manner that the first plate 4 can be raised and lowered by a load motor 71.

The other one of the plates, namely, the second plate 5, is disposed below the first plate 4 in such a manner that the axis of the second plate 5 matches with that of the first plate 4. A sheet film 8 is held on an upper surface of the second plate 5, and the second plate 5 functions as "film holding means" of the present invention. More precisely, the second plate 5 comprises a main plate 51, a quartz stage 52 which is capable of holding the sheet film 8 on an upper surface of the main plate 51, and heating lamps 53 which heat the sheet film 8. The sheet film 8 is formed in the shape of a circle which is larger than the substrate W, and an insulation film 81 which is a thin film is formed on a surface of the sheet film 8. As the sheet film 8, a thermoplastic resin film 82 is used in this embodiment. The insulation film 81 is obtained by applying on the sheet film 8 a coating fluid of an SOG material for forming insulation film into the thickness of 1 μm or more. The insulation film 81 is used as the thin film.

On the upper surface side of the main plate 51, a concave 511 is formed. The plane size of the concave 511 is slightly larger than that of the substrate W and is directed toward the first plate 4 as shown in FIG. 2. The four heating lamps 53 are buried inside the concave 511, and the quartz stage 52 is located at the position of the opening of the concave 511. The sheet film 8 can be placed on an upper surface of the quartz stage 52 in such a manner that the insulation film 81 disposed on the sheet film 8 is directed toward the substrate W which is held on the first plate 4.

A film holding/straining unit 9 is disposed at the periphery of the main plate 51, so as to hold the sheet film 8 mounted on the quartz stage 52 during transfer of the insulation film 81 and to strain the sheet film 8 at the timing described later.

In addition, as shown in FIG. 1, the heating lamps 53 are electrically connected with a lamp controller 54, and the lamp controller 54 controls turning on and turning off of the heating lamps 53 based on a lamp control signal which is received from the control unit 3. Hence, as the lamp control signal which demands to turn on the heating lamps 53 is supplied from the control unit 3 to the lamp controller 54, the heating lamps 53 turn on and heat waves emitted from the heating lamps 53 pass through the quartz stage 52 and irradiate the sheet film 8. This heats up the sheet film 8 to a temperature between 25° C. and 300° C.

Meanwhile, the second plate 5 is elastically supported by a plurality of compression coil springs 73 on a support plate 72, so that the loaded pressure of pressing the substrate W and the sheet film 8 against each other becomes uniform. Further, the support plate 72 is structured in such a manner that support columns 74 hold the support plate 72 for free upward and downward movements, and that the support plate is accordingly raised and lowered by a load motor 75. According to this embodiment, a thin film forming process (transfer processing) which will be described next is performed while raising and lowering the two plates 4 and 5 in mutually opposite directions by means of the load motors 71 and 75, and the load motors 71 and 75 serve as "loading means" of the present invention.

The thin film forming process using the thin film forming apparatus above will now be described. According to this embodiment, the substrate W is mounted with its pattern-bearing surface (surface in which the electrode interconnection is formed) directed to below to the lower surface of the first plate 4. Meanwhile, the sheet film 8 denoted at the dashed line shown in FIG. 2 is supplied with the insulation film 81 directed to above over the stage 52 of the second plate 5, and an outer peripheral portion of the sheet film 8 is held by the film holding/straining unit 9. At this stage, the film holding/straining unit 9 does not strain the sheet film 8 yet.

Figure 3:
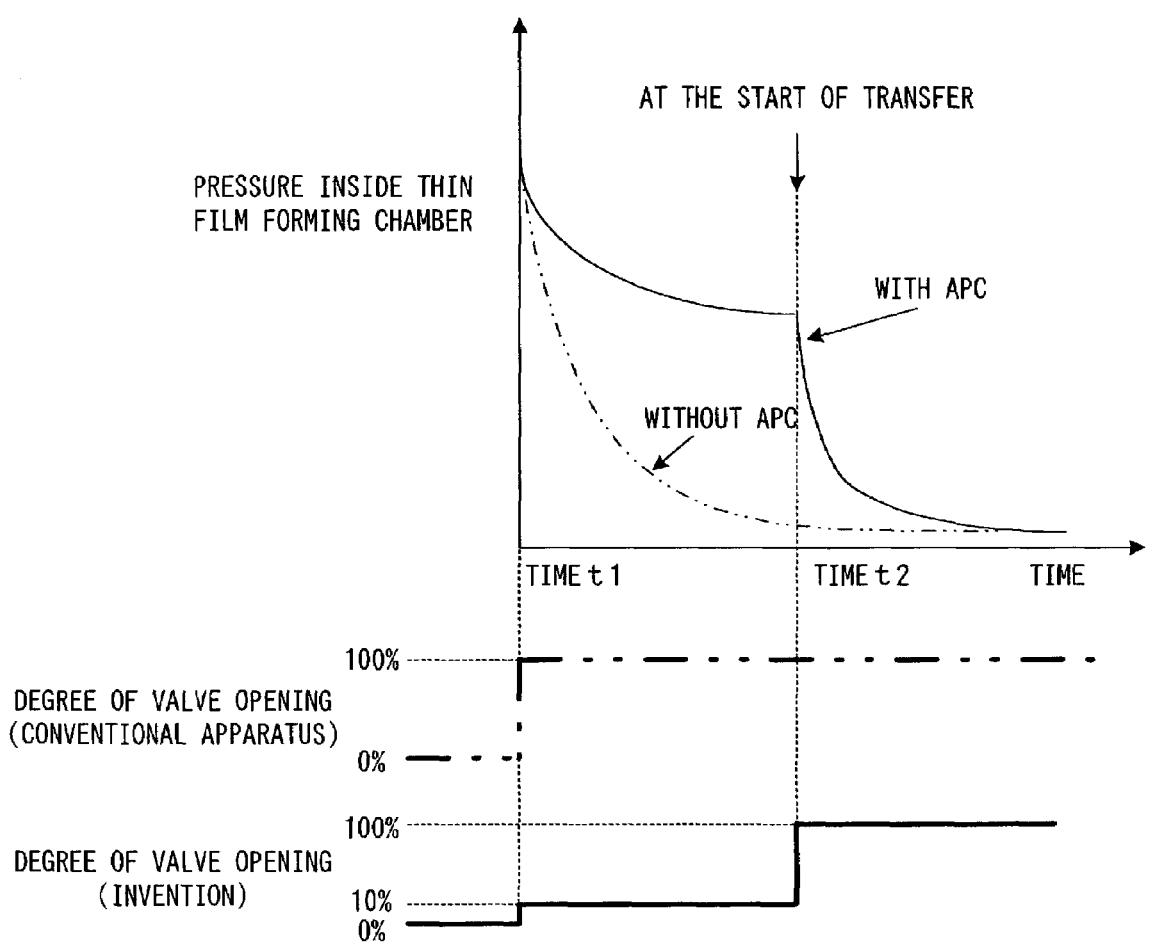
FIG. 3 is a drawing which shows operations of the thin film forming apparatus shown in FIG. 1.

As the substrate W and the sheet film 8 are loaded in and mounted (time t1) in this manner, the control unit 3 controls the respective portions of the apparatus in accordance with a transfer program which is stored in a memory (not shown) in advance, and the transfer processing is then executed to thereby transfer the insulation film 81 to the substrate W. The transfer processing will now be described in detail with reference to FIG. 3. The graph in FIG. 3 shows the pressure inside the thin film forming chamber 11, wherein the thick solid line denotes the degree of opening of the butterfly valve 21 in this embodiment. As the amount of valve opening increases, the volume of exhaust air per unit time becomes larger.

(1) First, at the time t1, the control unit 3 outputs to the valve controller 23 the valve opening signal which demands the butterfly valve 21 to open 10% of the full-opening. In response, the valve controller 23 makes the completely closed butterfly valve 21 partially open and operate, whereby the vacuum pump 22 starts evacuating and depressurizing the thin film forming chamber 11 by about 10% of the maximum volume of exhaust air. The pressure inside the thin film forming chamber 11 then gradually decreases as denoted at the solid line (with APC) in the top section of the graph in FIG. 3. In addition, at the time t1, the control unit 3 sends a gas supply signal to the mass flow controller 14. Regardless of the pressure inside the thin film forming chamber 11, the mass flow controller 14 maintains the flow rate of nitrogen gas which is supplied through the inlet 13.

(2) As depressurization achieves a desired pressure, in response to a control signal from the heater controller 61, the heater 6 is energized and the first plate 4 is heated up to about 200° C., whereby the substrate W is heated up to a desirable temperature. Meanwhile, as for the sheet film 8 as well, the heating lamps 53 turn on, the second plate 5 is heated up to about 100° C. And the control unit 3 sends a signal to the load motor 75, whereby the plate 5 starts moving upward or downward. The second plate 5 moves up to the position of the sheet film 8, and the stage 52 contacts the sheet film 8. The sheet film 8 is accordingly heated up and strained, and the sheet film 8 sags in a wave-like shape. Noting this, in this embodiment, the film holding/straining unit 9 strains the sheet film 8 and the wave-like sag is removed.

(3) At the same time of straining the sheet film 8, the first plate 4 as it is driven by the load motor 71 moves downward, the substrate W is pressed against the sheet film 8, and transfer of the insulation film 81 to the substrate W is started. Further, receiving the valve opening signal which demands the butterfly valve 21 to open 100%, the valve controller 23 completely opens the butterfly valve 21, and the vacuum pump 22 evacuates and depressurizes the thin film forming chamber 11 by the maximum volume of exhaust air (time t2). Thus, as denoted at the solid line (with APC) in the top section of the graph in FIG. 3, transfer of the insulation film 81 to the substrate W is carried out while the pressure inside the thin film forming chamber 11 rapidly decreases. During the transfer (time t2 and later), the substrate W and the sheet film 8 are pressed against each other under a predetermined load for a constant period of time, with the butterfly valve 21 totally open. During this period as well, heating of the substrate W and the sheet film 8 continues so that the substrate W and the sheet film 8 stay at the predetermined temperature.

(4) As a series of loading operations finishes and the transfer processing completes, the control unit 3 sends a signal to the load motors 71 and 75 in such a manner that zero load is applied, thereby returning the first and the second plates 4 and 5 to their original initial positions. After the both plates 4 and 5 return to their initial positions, the butterfly valve 21 is closed and the vacuum pump 22 is stopped.

(5) Next, waiting for the pressure inside the thin film forming chamber 11 to return to the atmospheric pressure, the control unit sends a gas supply stop signal to the mass flow controller 14. The supply of nitrogen gas to the thin film forming chamber 11 is thus stopped. In addition, the substrate W now integrated with the sheet film 8 with the insulation film 81 held between the substrate W and the sheet film 8 is unloaded from the thin film forming chamber 11, the sheet film 8 is peeled off from the substrate W, and the substrate W seating the insulation film 81 is obtained.

As described above, according to this embodiment, the pressure control unit 2 is disposed, and during the transfer comprised of the operations (1) through (3) above, the volume of exhaust air per unit time is controlled and the pressure inside the thin film forming chamber 11 is adjusted. In consequence, the insulation film 81 is transferred favorably to the pattern-bearing surface of the substrate W. The reason will now be described in comparison with the conventional apparatus.

In the conventional apparatus, the pressure inside the thin film forming chamber 11 is controlled as denoted at the chain double-dashed line in FIG. 3 during execution of the transfer. That is, since the vacuum pump 22 evacuates and depressurizes the thin film forming chamber 11 by the maximum volume of exhaust air immediately at the time t1, the pressure inside the thin film forming chamber 11 quickly decreases starting at the time t1, and the substrate W and the sheet film 8 are heated and the sheet film 8 is strained in this depressurized state (state of high-degree of vacuum). This progressively dries the insulation film 81 and largely damages the fluidity of the insulation film 81, and therefore, when transfer of the insulation film 81 to the substrate W is started at the time t2 with the substrate W pressed against the sheet film 8, the insulation film 81 may fail to be tightly adhered along the pattern-bearing surface of the substrate W.

In contrast, according to this embodiment, the problem above is solved since the degree of opening of the butterfly valve 21 is reduced before starting transfer of the insulation film 81 to the substrate W (from the time t1 until the time t2). The controlling of the valve opening allows that an increase in degree of vacuum is suppressed therebefore whereby evaporation of the solvent component contained in the insulation film 81 is restrained and the fluidity of the insulation film 81 is ensured at the start of the transfer (time t2). Further, since the butterfly valve 21 is totally opened at the start of the transfer and the pressure inside the thin film forming chamber 11 is quickly decreased, it is possible to transfer the insulation film 81 to the substrate W always in a low-pressure state (high-degree of vacuum) and to realize excellent transfer. In addition, according to this embodiment, the atmosphere inside the thin film forming chamber 11 is exhausted through the exhaust vent 12 while supplying nitrogen gas into the thin film forming chamber 11 through the mass flow controller 14. Hence, it is possible to eject a contaminant, unwanted vapor of the solvent and the like which float within the thin film forming chamber 11 from within the thin film forming chamber 11, and to realize excellent transfer.

The present invention is not restricted by the preferred embodiment above, but may be modified appropriately to the extent matching the intention of the invention. For instance, although the preferred embodiment above requires to set the degree of opening of the butterfly valve 21 to 10% of the full-opening from the time t1 until the time t2 but to 100% at and after the time t2, the degree of the valve opening is not limited to this. With the valve opening set such that at least the volume of exhaust air per unit time prior to transfer of the insulation film 81 to the substrate W would be smaller than the volume of exhaust air per unit time during the transfer of the insulation film 81 to the substrate W, a similar effect is obtainable. However, since the level of evaporation of the solvent may be different under the same pressure depending on the material of the insulation film 81, it is desirable to set the degree of opening of the butterfly valve 21 in accordance with the material of the insulation film 81.

In addition, although the degree of opening of the butterfly valve 21 is fixed to 10% of the full-opening before the start of the transfer (the period from the time t1 until the time t2) in this embodiment, the degree of opening of the butterfly valve 21 may be changed successively or stepwise.

Further, while the pressure inside the thin film forming chamber 11 is adjusted and controlled using the butterfly valve 21 as the exhaust adjusting unit in this embodiment, used as the exhaust adjusting unit to replace the butterfly valve 21 may be any pressure adjusting mechanism which is capable of adjusting the volume of exhaust air from the thin film forming chamber 11 to the vacuum pump 22.

Further, although the preferred embodiment above uses the vacuum pump 22 as the exhausting unit, used as the vacuum pump 22 may any exhausting mechanism which is capable of evacuating the thin film forming chamber.

Figure 4:
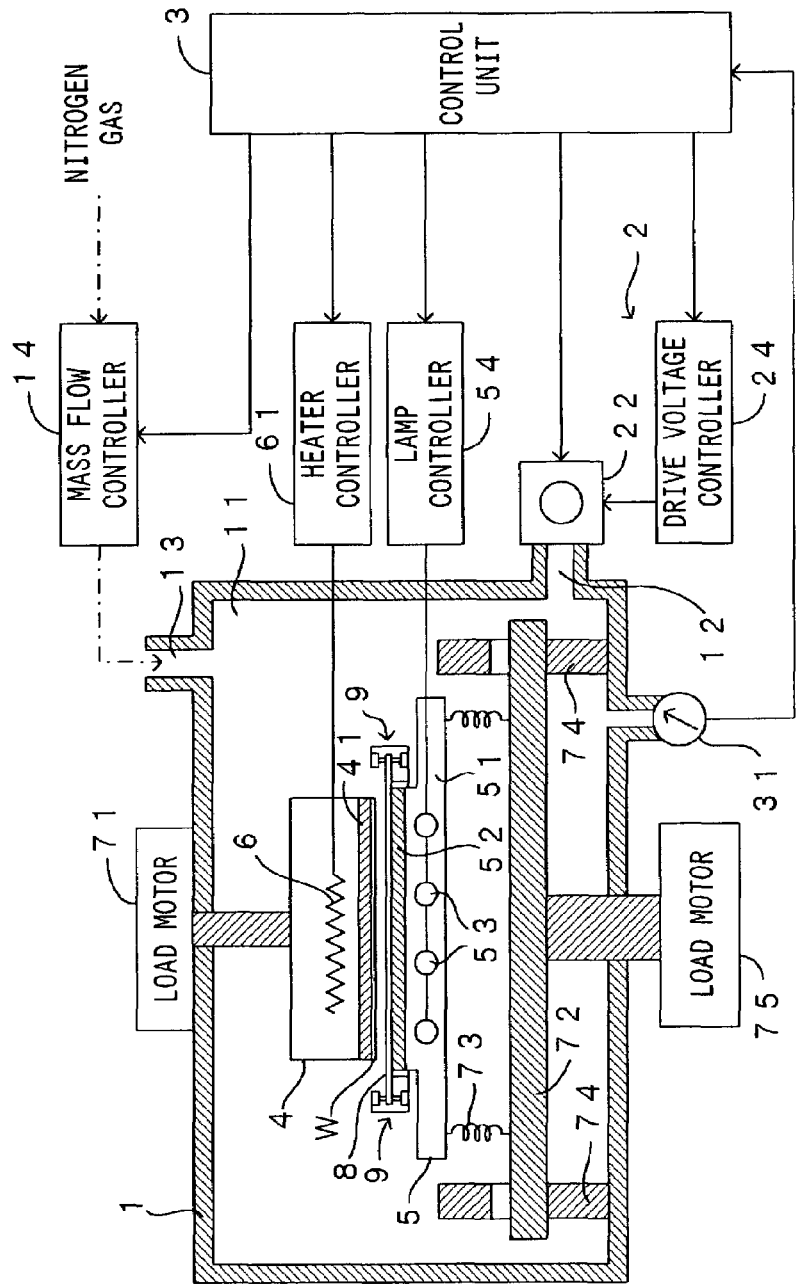
FIG. 4 is a drawing of other preferred embodiment of the thin film forming apparatus according to the present invention.
Figure 5:
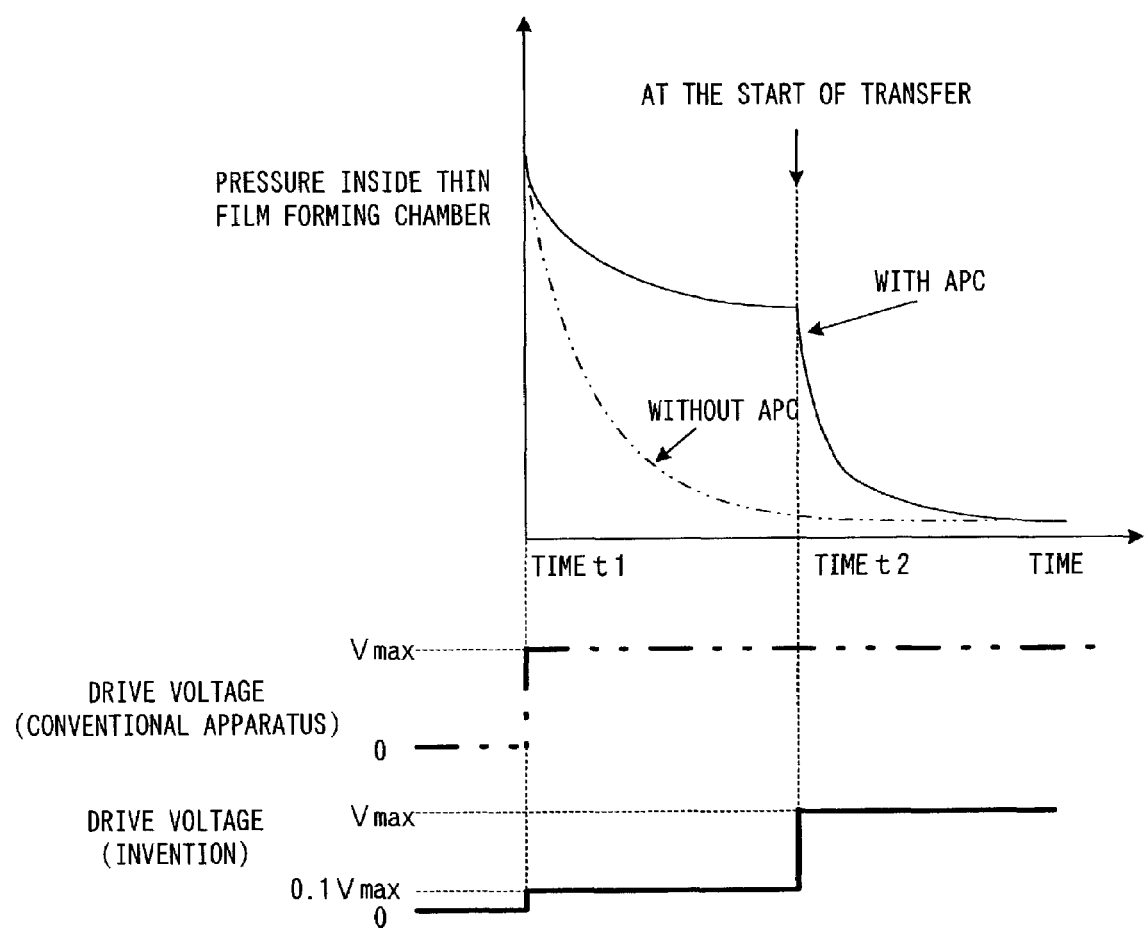
FIG. 5 is a drawing which shows operations of the thin film forming apparatus shown in FIG. 4.

Further, although the valve controller 23 controls the butterfly valve 21 to thereby control the volume of exhaust air per unit time according to the preferred embodiment above, a voltage applied upon the vacuum pump 22 may be controlled to thereby control the volume of exhaust air per unit time as shown in FIGS. 4 and 5.

FIG. 4 is a drawing of other preferred embodiment of the thin film forming apparatus according to the present invention. A major difference of this embodiment from the preferred embodiment shown in FIG. 1 is that a drive voltage controller 24 is disposed instead of the butterfly valve 21 and the valve controller 23. The other structure is the same. In this thin film forming apparatus, as shown in FIG. 5, as a drive voltage applied upon the vacuum pump 22 is controlled and the evacuating capability of the vacuum pump 22 is accordingly changed. That is, before starting transfer of the insulation film 81 to the substrate W (from the time t1 until the time t2), the drive voltage applied upon the vacuum pump 22 is set low and the volume of exhaust air per unit time is suppressed, whereby an increase in degree of vacuum is suppressed. This suppresses evaporation of the solvent component contained in the insulation film 81, and ensures the fluidity of the insulation film 81 at the start of the transfer (time t2). On the other hand, starting at the start of the transfer, the drive voltage applied upon the vacuum pump 22 is increased up to a maximum applied voltage Vmax, to thereby increase the volume of exhaust air per unit time. This rapidly decreases the pressure of the thin film forming chamber 11 and allows to transfer the insulation film 81 to the substrate W always in a low-pressure state (high-degree of vacuum), which realizes excellent transfer.

While the foregoing demands to set the applied voltage upon the vacuum pump 22 to 10% of the maximum applied voltage Vmax from the time t1 until the time t2 but to the maximum applied voltage Vmax at and after the time t2, the applied voltage is not limited to this. With the applied voltage set such that at least the volume of exhaust air per unit time prior to transfer of the insulation film 81 to the substrate W would be smaller than the volume of exhaust air per unit time during the transfer of the insulation film 81 to the substrate W, a similar effect is obtainable. However, since the level of evaporation of the solvent may be different under the same pressure depending on the material of the insulation film 81, it is desirable to set the applied voltage in accordance with the material of the insulation film 81. Alternatively, the applied voltage may be changed successively or stepwise.

Although the preferred embodiments above demand that the first plate 4 functions as the substrate holding means and the second plate 5 functions as the film holding means, the second plate 5 may function as the substrate holding means and the first plate 4 may function as the film holding means.

Further, although the sheet films 8 are formed in the shape of a disk and applied to a thin film forming apparatus in which the sheet films 8 are supplied to the first and the second plates 4 and 5 one after another and pressed according to the preferred embodiments above, the present invention is readily applicable to a thin film forming apparatus which uses a roll-like sheet film. Further, although the first and the second. plates 4 and 5 are raised and lowered using the load motors 71 and 75 in the preferred embodiments above, only one of the first and the second plates 4 and 5 may be moved. Further, although the load motors 71 and 75 are used as a loading mechanism to apply a load, this is not limiting. Any other means may be used instead as a mechanism of pressing the first and the second plates 4 and 5 against each other.

Further, although the sheet film 8 formed by a thermoplastic resin film is used in the preferred embodiments above, this is not limiting. A metallic film, a flat plate or the like may be used instead, of course.

Further, although an insulation film is disposed on the sheet film 8 in the preferred embodiments above, the insulation film may be other thin film which can be disposed on the sheet film, such as a metallic thin film or the like. Further, while the preferred embodiments above are examples that a thin film is formed on a semiconductor substrate, this is not limiting. The present invention is of course applicable to a mounting substrate, a substrate for liquid crystals and any other substrates which are used in relevance to an electronic component material, such as a multi-tip module.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A thin film forming apparatus, comprising:
a processing container whose inside is a thin film forming chamber;
substrate holding means which holds a substrate in said thin film forming chamber;
film holding means which is disposed to face said substrate holding means in said thin film forming chamber, and holds a sheet film in a condition that a thin film disposed on a surface of said sheet film is directed toward said substrate;
loading means which moves at least one of said substrate holding means and said film holding means, presses said substrate and said sheet film against each other, and transfers said thin film to said substrate; and
pressure controlling means which adjusts the pressure inside said thin film forming chamber in accordance with an operating state of at least said loading means,
wherein said pressure controlling means comprises:
an exhausting unit which is linked to said thin film forming chamber and evacuates said thin film forming chamber;
an exhaust adjusting unit which is inserted between said exhausting unit and said thin film forming chamber and is capable of adjusting the volume of exhaust air per unit time exhausted from said thin film forming chamber to said exhausting unit; and
a pressure adjusting unit which controls said exhaust adjusting unit in accordance with an operating state of said loading means and accordingly adjusts the pressure inside said thin film forming chamber.

2. The thin film forming apparatus of claim 1, wherein said pressure adjusting unit sets the volume of exhaust air per unit time before the start of transfer of said thin film to be smaller than the volume of exhaust air per unit time during the transfer of said thin film.

3. The thin film forming apparatus of claim 1, wherein said pressure controlling means comprises gas supplying means which is linked to said thin film forming chamber and supplies gas to said thin film forming chamber.

4. The thin film forming apparatus of claim 3, wherein said gas supplied to said thin film forming chamber is nitrogen gas.

5. The thin film forming apparatus of claim 3, wherein said gas supplying means comprises a mass flow controller which controls the inflow of said gas which is supplied to said thin film forming chamber.

6. The thin film forming apparatus of claim 5, wherein said mass flow controller maintains the flow rate of said gas which is supplied to said thin film forming chamber regardless of the pressure inside said thin film forming chamber.

7. The thin film forming apparatus of claim 1, wherein said pressure controlling means adjusts the pressure inside said thin film forming chamber at the start of said transfer of said thin film to said substrate by said loading means.

8. A thin film forming apparatus, comprising:
a processing container whose inside is a thin film forming chamber;
substrate holding means which holds a substrate in said thin film forming chamber;
film holding means which is disposed to face said substrate holding means in said thin film forming chamber, and holds a sheet film in a condition that a thin film disposed on a surface of said sheet film is directed toward said substrate;
loading means which moves at least one of said substrate holding means and said film holding means, presses said substrate and said sheet film against each other, and transfers said thin film to said substrate; and
pressure controlling means which adjusts the pressure inside said thin film forming chamber in accordance with an operating state of at least said loading means,
wherein said pressure controlling means comprises:
an exhaust pump which is linked to said thin film forming chamber and evacuates said thin film forming chamber; and
a pressure adjusting unit which controls a voltage applied upon said exhaust pump in accordance with an operating state of said loading means and accordingly adjusts the pressure inside said thin film forming chamber.

9. The thin film forming apparatus of claim 8, wherein said pressure adjusting unit sets the applied voltage upon said exhaust pump before the start of transfer of said thin film to be smaller than the applied voltage upon said exhaust pump during the transfer of said thin film.

10. The thin film forming apparatus of claim 8, wherein said pressure controlling means comprises gas supplying means which is linked to said thin film forming chamber and supplies gas to said thin film forming chamber.

11. The thin film forming apparatus of claim 8, wherein said pressure controlling means adjusts the pressure inside said thin film forming chamber at the start of said transfer of said thin film to said substrate by said loading means.

12. A thin film forming apparatus, comprising:
a processing container whose inside is a thin film forming chamber;
substrate holding means which holds a substrate in said thin film forming chamber;
film holding means which is disposed to face said substrate holding means in said thin film forming chamber, and holds a sheet film in a condition that a thin film disposed on a surface of said sheet film is directed toward said substrate;
loading means which moves at least one of said substrate holding means and said film holding means, presses said substrate and said sheet film against each other, and transfers said thin film to said substrate;
pressure controlling means which adjusts the pressure inside said thin film forming chamber in accordance with an operating state of at least said loading means; and
exhausting means which evacuates said thin film forming chamber,
wherein said pressure controlling means adjusts the volume of exhaust air per unit time exhausted by said exhausting means from said thin film forming chamber and controls the pressure inside said thin film forming chamber in such a manner that the pressure inside thin film forming chamber becomes different between before and during the transfer.

13. The thin film forming apparatus of claim 12, wherein said pressure controlling means evacuates and depressurizes said thin film forming chamber from before the transfer, and in response to the start of the transfer, increases the volume of exhaust air from said thin film forming chamber per unit time so that the volume of exhaust air becomes larger than that before the transfer and the pressure inside said thin film forming chamber further decreases.

14. The thin film forming apparatus of claim 12, wherein said pressure controlling means comprises gas supplying means which supplies gas to said thin film forming chamber.

* * * * *